United States Patent
Jeong et al.

(10) Patent No.: US 8,384,072 B2
(45) Date of Patent: Feb. 26, 2013

(54) ORGANIC LIGHT EMITTING DIODE DISPLAY

(75) Inventors: Hee-Seong Jeong, Yongin (KR); Sung-Soo Koh, Yongin (KR); Tae-Gon Kim, Yongin (KR); Seung-Yeon Cho, Yongin (KR); Chul-Woo Jeong, Yongin (KR); Jae-Yong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 134 days.

(21) Appl. No.: 13/004,399

(22) Filed: Jan. 11, 2011

(65) Prior Publication Data

US 2011/0168988 A1 Jul. 14, 2011

(30) Foreign Application Priority Data

Jan. 11, 2010 (KR) .......................... 10-2010-0002326

(51) Int. Cl.
*H01L 51/00* (2006.01)

(52) U.S. Cl. ..................... 257/40; 257/E51.022; 438/29; 438/35

(58) Field of Classification Search ............... 257/40, 257/E51.019–E51.022; 438/29, 35
See application file for complete search history.

(56) References Cited

U.S. PATENT DOCUMENTS

2009/0200544 A1* 8/2009 Lee et al. ........................ 257/40

FOREIGN PATENT DOCUMENTS

| JP | 2008-034288 A | 2/2008 |
| KR | 10-2006-0100762 A | 9/2006 |
| KR | 10-2007-0087773 A | 8/2007 |
| KR | 10-2007-0092079 A | 9/2007 |
| KR | 1020090105153 | 10/2009 |

* cited by examiner

*Primary Examiner* — Julio J Maldonado
*Assistant Examiner* — Daniel Shook
(74) *Attorney, Agent, or Firm* — Knobbe Martens Olson & Bear LLP

(57) ABSTRACT

An OLED display is disclosed. The display includes: a substrate main body, and an organic light emitting diode (OLED) formed on above the substrate main body, where the OLED includes: a first electrode injecting holes, a second electrode injecting electrons, an emission layer formed between the first and second electrodes, a hole injection layer (HIL) and a hole transport layer (HTL) sequentially formed between the first electrode and the emission layer, and a semi-transparent layer formed between the first electrode and the emission layer in red and green pixels.

5 Claims, 4 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2010-0002326 filed in the Korean Intellectual Property Office on Jan. 11, 2010, the entire contents of which are incorporated herein by reference.

BACKGROUND

1. Field

The field relates generally to an organic light emitting diode (OLED) display. More particularly, it relates to an OLED display that can improve light efficiency and color reproduction rate while reducing the number of black spots.

2. Description of the Related Technology

An organic light emitting diode (OLED) display device is a self emissive display device that displays images using organic light emitting diodes. The organic light emitting diode display differs from a liquid crystal display (LCD) in that it does not require a separate light source, and has relatively small thickness and weight. The organic light emitting diode display exhibits characteristics such as low power consumption, high luminance, and short response time, and has therefore been considered a next generation display device for portable electronic appliances.

OLED devices typically include a hole injection electrode, an organic emission layer, and an electron injection electrode. Holes supplied from the hole injection electrode and electrons supplied from the electron injection electrode are combined within the organic emission layer so as to form excitons. The OLED display device emits light with energy generated when the excitons return to the ground state.

In order to improve the efficiency of the light generated from the organic emission layer, a microcavity effect has been used. In a top light emission device, the microcavity effect uses a theory that light beams are iteratively reflected by a reflection layer (e.g., an anode) and a transflective layer (e.g., a cathode) that have a predetermined gap (e.g., an optical path length) therebetween, and that a strong interference effect occurs between the iteratively reflected light beams such that light beam having a specific wavelength is amplified and light beams having other wavelengths are offset. Accordingly, color reproducibility and luminance are improved in the front of the device.

The microcavity effect provides a color filter effect for transmission of a light beam of a color. The filter effect is dependent on the thickness of the organic emission layer. The thicknesses of red, green, and blue organic emission layers are set corresponding to the respective wavelengths. The thickness of the organic emission layer is set to be the thinnest at the first cavity (thin film cavity) and is set to be thicker at the next cavity (thick film cavity). Since transmission energy is dispersed into several wavelength bands after the second cavity and beyond, an out-coupling effect is highest at the first cavity. Therefore, the light efficiency can be enhanced by using the first cavity structure (i.e., thin film cavity).

Thin film cavity increases the number of black spots depending on the condition of the surface of the anode or of the particles, because the organic emission layer is thin. Furthermore, the thin film cavity is inferior to the thick film cavity in terms of color purity and color reproduction rate. Thus, a blue pixel forming a relatively thinner film cavity than red and green pixels has color purity that is lower than the sRGB standard color coordinate and a color reproduction rate that is lower than that of a typical CRT. Therefore, a method for improving light efficiency while reducing the number of black spots due to the thin film cavity in red and green pixels as well as improving the color reproduction rate of the blue pixel is needed.

The information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One aspect is an organic light emitting diode (OLED) display including: a substrate main body, and an organic light emitting diode (OLED) formed on above the substrate main body, where the OLED includes: a first electrode injecting holes, a second electrode injecting electrons, an emission layer formed between the first and second electrodes, a hole injection layer (HIL) and a hole transport layer (HTL) sequentially formed between the first electrode and the emission layer, and a semi-transparent layer formed between the first electrode and the emission layer in red and green pixels.

The semi-transparent layer may be formed in at least one of the hole injection layer (HIL), the hole transport layer (HTL), between the hole injection layer (HIL) and the hole transport layer (HTL), and between the hole transport layer (HTL) and the emission layer.

In the red and green pixels, the injection layer (HIL) may include a first hole injection layer (HIL) formed between the first electrode and the semi-transparent layer, and a second hole injection layer (HIL) formed between the semi-transparent layer and the emission layer.

In a blue pixel, the hole injection layer (HIL) may have a thickness that is greater than the sum of the thicknesses of the first hole injection layer (HIL) and the semi-transparent layer and that is smaller than the sum of the thicknesses of the first hole injection layer (HIL), the semi-transparent layer, and the second hole injection layer (HIL).

The semi-transparent layer may comprise a metal.

The semi-transparent layer may comprise at least one of Al, Ag, Ca, CaAg, AlAg, MgAg, and an alloy thereof.

As described, in the red and green pixels, a semi-transparent layer is provided between the first electrode and the emissive layer to exclude a part of the thickness of organic material layers from the cavity thickness set between the first electrode and the emissive layer according to the exemplary embodiment. Therefore, the number of black spots is reduced while increasing the entire thickness between the emissive layer and the first electrode and simultaneously thin film cavities are respectively formed between the semi-transparent layer and the first electrode and between the semi-transparent layer and the emissive layer such that light efficiency can be improved.

In addition, since the semi-transparent layer is not used in the blue pixel, a thick film cavity is formed between the first electrode and the emissive layer in the blue pixel compared to the thin film cavities in the red and green pixels. Accordingly, the color reproduction rate can be improved by setting the color representation capability of the blue pixel to be higher than the sRGB standard color coordinate.

DETAILED DESCRIPTION OF CERTAIN INVENTIVE EMBODIMENTS

Figure 1:
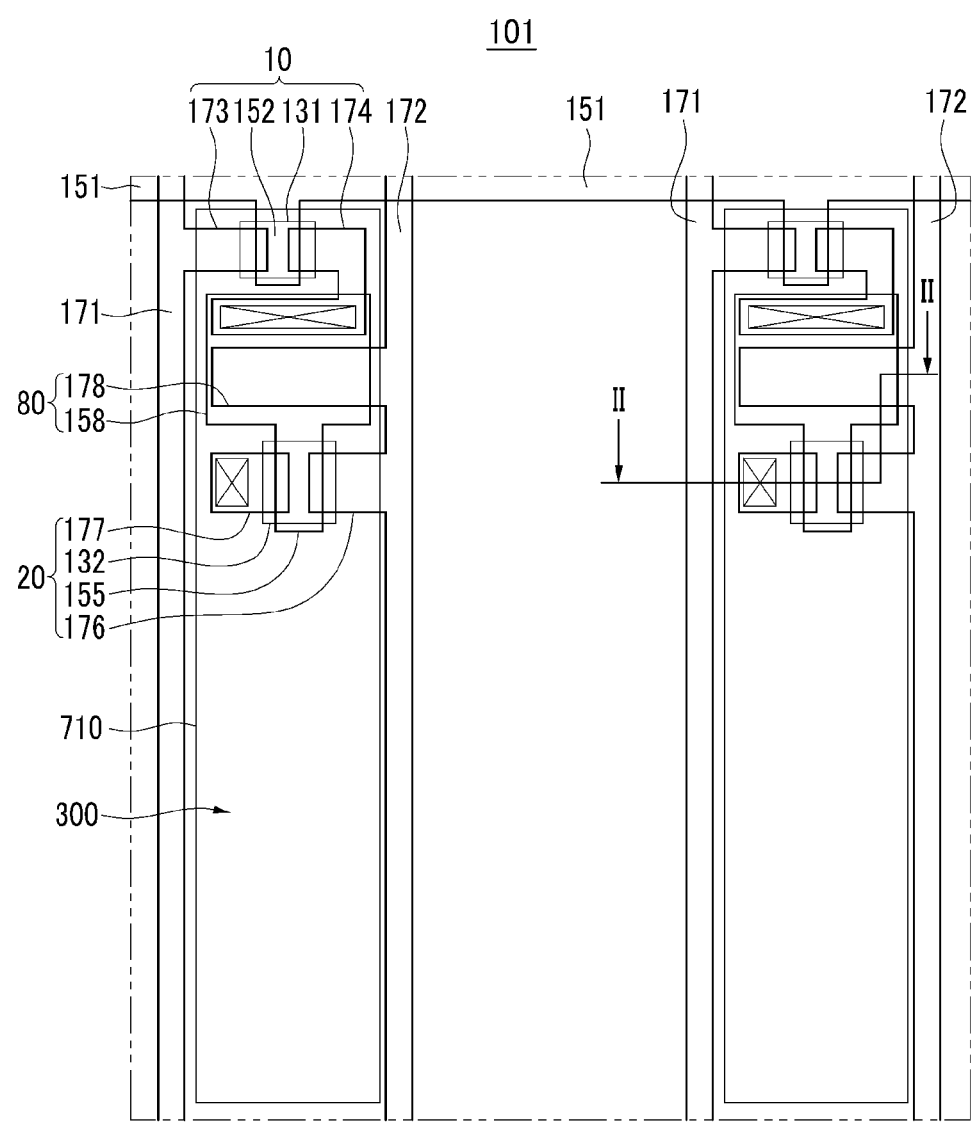
FIG. 1 is a pixel layout view of an embodiment of an organic light emitting diode (OLED) display.

In the following detailed description, only certain exemplary embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements.

Hereinafter, exemplary embodiments of the present invention will be described in more detailed with reference to the accompanying FIG. 1 to FIG. 4.

Figure 2:
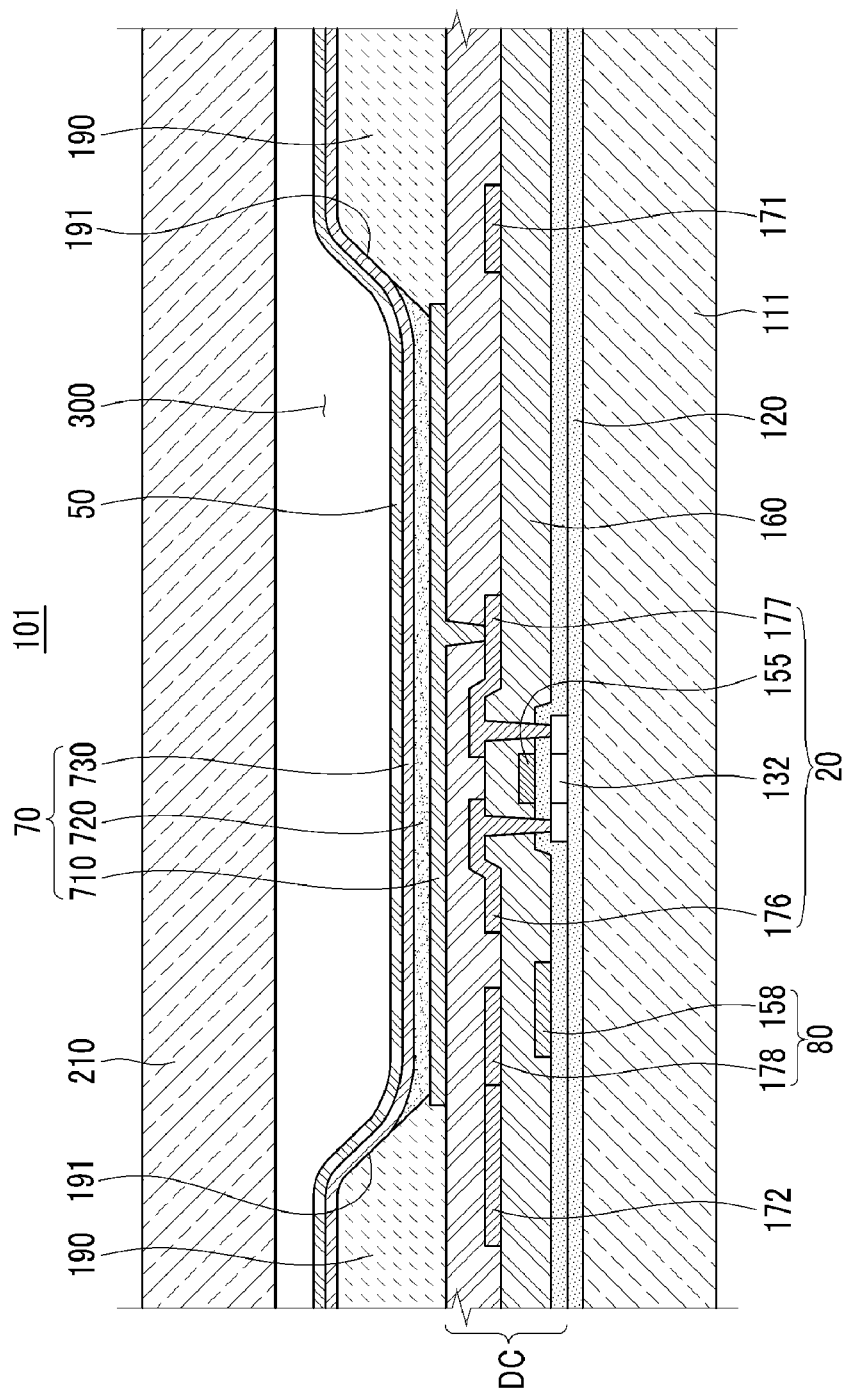
FIG. 2 is a cross-sectional view of section II-II of FIG. 1.

FIG. 1 is a pixel layout view of an embodiment of an organic light emitting diode (OLED) display and FIG. 2 is a cross-sectional view of section II-II of FIG. 1. Referring to FIG. 1 and FIG. 2, an OLED display 101 according to an exemplary embodiment includes a substrate main body 111, a driving circuit (DC), an organic light emitting element (organic light emitting diode, OLED) 70, a capping layer 50, and an encapsulation substrate 210. As shown in FIG. 2, the OLED display 101 may also include a buffer layer 120 and a pixel defining layer 190 in some embodiments.

In some embodiments, the substrate main body 111 may be formed of an insulating substrate made of glass, quartz, ceramic, plastic or the like. In other embodiments, the substrate main body 111 may be made of a metallic substrate such as stainless steel or the like.

As shown in FIG. 2, the buffer layer 120 is disposed on the substrate main body 111. The buffer layer 120 may be formed of at least one of various inorganic and organic layers. The buffer layer 120 helps prevent penetration of unnecessary components such as impurity elements or moisture into the driving circuit DC and/or the OLED 70, and simultaneously planarizes the surface. In some embodiments, depending on the type and processing conditions of the substrate main body 111, the buffer layer 120 may be omitted.

The driving circuit DC is formed on the buffer layer 120. The driving circuit DC includes a plurality of thin film transistors 10 and 20, and drives the OLED 70. The OLED 70 emits light, used to display an image, according to a driving signal transmitted from the driving circuit DC.

In some embodiments, the OLED 70 includes a first electrode 710, which functions as an anode injecting holes, a second electrode 730, which functions as a cathode injecting electrons, and an organic layer 720 disposed between the first and second electrodes 710 and 730. In other embodiments, the first electrode 710 may function as the cathode and the second electrode 730 may function as the anode.

In some embodiments, the OLED display 101 is configured as a front emission type of display. In such embodiments, the first electrode 710 includes a reflective layer 711 and the second electrode 730 includes a transflective layer (not shown). Thus, light emitted from the organic layer 720 is passed through the second electrode 730 and then emitted.

The reflective layer 711 and the transflective layer may be formed using at least one of magnesium (Mg), silver (Ag), gold (Au), calcium (Ca), lithium (Li), chromium (Cr), and aluminum (Al), or an alloy thereof. The characteristics of the reflective layer and the transflective layer are determined by their respective thicknesses. For example, light transmittance of the transflective layer is inversely proportional to its thickness.

The pixel defining layer 190 has an opening 191. The opening 191 of the pixel defining layer 190 partially exposes the first electrode 710. In addition, the first electrode 710, the organic layer 720, and the second electrode 730 are sequentially stacked within the opening 191 of the pixel defining layer 190. The second electrode 730 is formed not only on the organic layer 720 but also on the pixel defining layer 190. Excluding the emissive layer 721, other layers of the organic layer 720 may be disposed between the pixel defining layer 190 and the second electrode 730. The OLED 70 emits light in the organic layer 720 formed within the opening 191 of the pixel defining layer 190. The opening 191 of the pixel defining layer 190 defines a light emission area.

A capping layer 50 is formed on the OLED 70. The capping layer 50 may protect the OLED 70 and simultaneously help efficiency of external emission of light generated in the organic layer 720.

The encapsulation substrate 210 is an insulating substrate made of glass, quartz, ceramic, plastic or the like. The encapsulation substrate 210 is coupled with the substrate main body 111 in a sealed manner to cover the OLED 70. In some embodiments, the encapsulation substrate 210 and the OLED 70 are separated from each other. A space between the encapsulation substrate 210 and the substrate main body 111 is sealed by a sealant (not shown). An air layer 300 is formed in a gap between the encapsulation substrate 210 and the capping layer 50.

In some embodiments, the OLED display 101 is an active matrix (AM) OLED display with a 2Tr-1Cap structure where a pixel is provided with two thin film transistors (TFT) 10 and 20 and one capacitor 80. In other embodiments, a pixel of the OLED display 101 may be provided with three or more TFTs and two or more capacitors, and additional wires may be further provided. A pixel is a minimal unit for displaying an image, and the OLED display 101 displays images through a plurality of pixels.

A switching thin film transistor 10, a driving thin film transistor 20, a capacitor 80, and an organic light emitting element (OLED) 70 are formed at each pixel. The driving circuit DC includes the switching thin film transistor 10, the driving thin film transistor 20, and the capacitor 80. The OLED display 101 includes gate lines 151 arranged in a direction, and data lines 171 and common power lines 172 crossing the gate lines 151 in an insulated manner. In some embodiments, a pixel may be defined by the gate lines 151, the data lines 171, and the common power lines 171.

The OLED 70 includes a first electrode 710, an organic layer 720 formed on the first electrode 710, and a second electrode 730 formed on the organic layer 720. Holes and electrons from the first electrode 710 and the second electrode 730 are respectively injected into the organic layer 720. When excitons being combinations of the injected holes and electrons fall from an excited state to a ground state, the OLED 70 emits light.

The capacitor 80 includes a pair of capacitor plates 158 and 178 with an interlayer insulating layer 160 interposed therebetween. The interlayer insulating layer 160 is formed of a dielectric material. The capacitance of the capacitor 80 is determined according to charges charged at the capacitor 80 and a voltage between the two capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch to select a pixel for light emission. The switching gate electrode 152 is connected to the gate lines 151. The switching source electrode 173 is connected to the data lines 171. The switching drain electrode 174 is disposed at a distance from the switching source electrode 173 and connected with one capacitor plate 158.

The driving thin film transistor 20 applies driving power to the first electrode 710 for light emission of the organic layer 720 of the OLED 70 in the selected pixel. The driving gate electrode 155 is connected to the capacitor plate 158 that is connected with the switching drain electrode 174. The driving source electrode 176 and the capacitor plate 178 are respectively connected to the common power lines 172. The driving drain electrode 177 is connected to the first electrode of the OLED 70 through a contact hole.

The switching thin film transistor 10 is driven by a gate voltage applied to the gate lines 151 to transmit a data voltage applied to the data lines 171 to the driving thin film transistor 20. A voltage corresponding to a voltage difference between a common voltage applied to the driving thin film transistor 20 from the common power line 172 and the data voltage transmitted from the switching thin film transistor 10 is stored in the capacitor 80, and a current corresponding to the voltage stored in the capacitor flows to the OLED 70 through the driving thin film transistor 20 such that the OLED 70 emits light.

Figure 3:
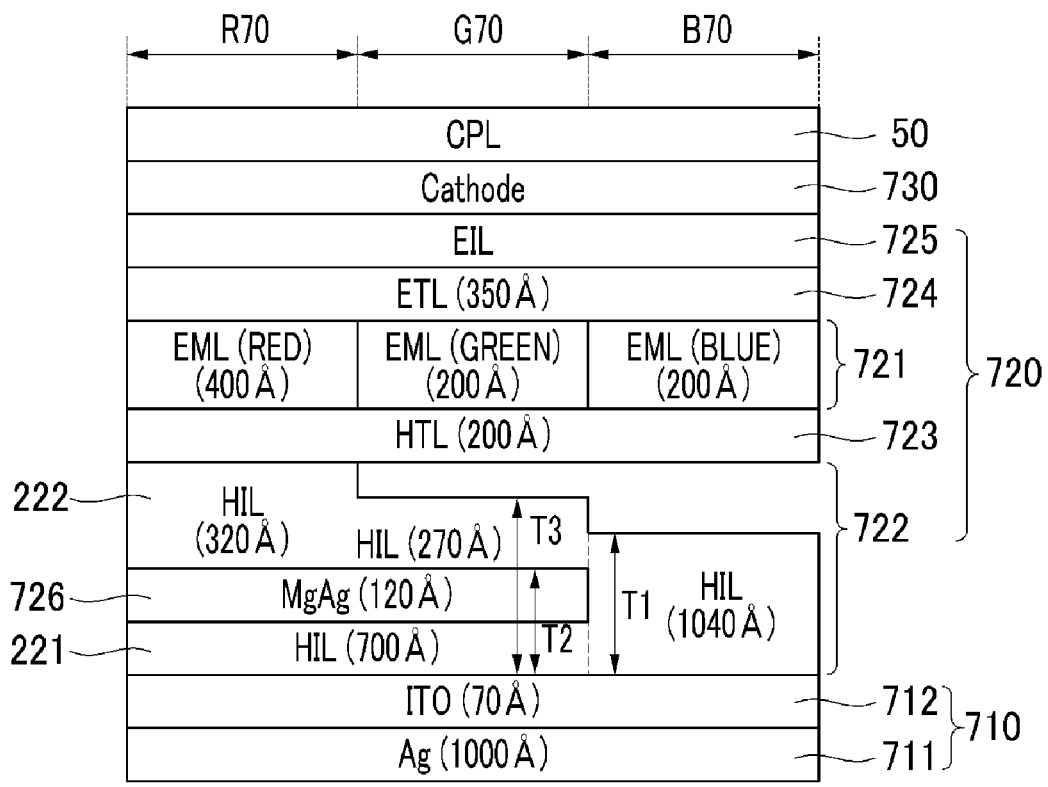
FIG. 3 is a magnified cross-sectional view of an embodiment of an organic light emitting element.

FIG. 3 is a magnified cross-sectional view of an embodiment of an organic light emitting element. Referring to FIG. 3, in some embodiments, the first electrode 710 may have a multi-layered structure including a reflective layer 711 and a transparent conductive layer 712. In some embodiments, the transparent conductive layer 712 is interposed between the reflective layer 711 and the organic layer 720. In other embodiments, the first electrode 710 may have a multi-layered structure including a transparent conductive layer, a reflective layer, and another transparent conductive layer stacked sequentially (not shown).

In some embodiments, the transparent conductive layer 712 is made of a material such as indium tin oxide (ITO), indium zinc oxide (IZO), zinc oxide (ZnO), or indium oxide ($In_2O_3$), and the like. The transparent conductive layer 712 has a relatively high work function. Therefore, a first electrode 710 including the transparent conductive layer 712 enables smooth hole injection.

In some embodiments, the second electrode 730 may be formed of a transparent conductive layer. In such embodiments, the second electrode 730 may function as an anode for hole injection (not shown) and the first electrode 710 may be function as a cathode formed of only a reflective layer.

Referring to the embodiment of FIG. 3, the organic layer 720 is formed of a multi-layered structure with an emissive layer (EML) 721 generating red, green, and blue light, a hole-injection layer (HIL) 722, a hole-transporting layer (HTL) 723, an electron-transporting layer (ETL) 724, and an electron-injection layer (EIL) 725. In other embodiments, the hole-injection layer (HIL) 722, the hole-transporting layer (HTL) 723, the electron-transporting layer (ETL) 724, and the electron-injection layer (EIL) 725 may be omitted. In the embodiment shown in FIG. 3, the hole injection layer (HIL) 722 is disposed on the first electrode 710 which functions as the anode, and the hole transport layer (HTL) 723, the emissive layer 721, the electron transport layer (ETL) 724, and the electron injection layer (EIL) 725 are sequentially disposed thereon. In other embodiments, the organic layer 720 may include other layers.

Still referring to the embodiment of FIG. 3, the organic layer 720 further includes a semi-transparent layer 726 formed between the first electrode 710 and the emissive layer 721 in a red pixel R70 and a green pixel G70. In the embodiment shown, the semi-transparent layer 726 is formed in the hole injection layer (HIL) 722, in the hole transport layer (HTL) 723, between the hole injection layer (HIL) 722 and the hole transport layer (HTL) 723. In other embodiments, the semi-transparent layer may be formed between the hole transport layer (HTL) 723 and the emissive layer 721. The semi-transparent layer 726 may comprise a metal. The metal may include at least one of Al, Ag, Ca, CaAg, AlAg, or MgAg, and an alloy thereof. In one embodiment, the semi-transparent layer is made of MgAg.

As shown in FIG. 3, in the red pixel R70 and the green pixel G70, the semi-transparent layer 726 may be formed in the hole injection layer (HIL) 722. Therefore, the hole injection layer (HIL) 722 is divided into a first hole injection sub-layer (HIL) 221 formed between the transparent conductive layer 712 and the semi-transparent layer 726 of the first electrode 710, and a second hole injection sub-layer (HIL) 222 formed between the semi-transparent layer 726 and the hole transport layer (HTL) 723.

In the embodiment of FIG. 3, in the red pixel R70 and green pixel G70, the first hole injection sub-layer (HIL) 221 has a thickness of 700 Å and the semi-transparent layer 726 has a thickness of at least 120 Å. The second hole injection sub-layer (HIL) 222 has a thickness of 320 Å in the red pixel R70 and 270 Å in the green pixel G70. The hole injection layer (HIL) 722 has a thickness of 1040 Å in the blue pixel B70. The hole transport layer (HTL) 723 has a thickness of 200 Å in the red, green, and blue pixels R70, G70, and B70. The emissive layer 721 has a thickness of 400 Å in the red pixel R70, 200 Å in the green pixel G70, and 200 Å in the blue pixel B70. In the red, green, and blue pixel R70, G70, and B70, the electron transport layer (ETL) 724 has a thickness of 350 Å.

The semi-transparent layer 726 forms an area where a cavity is excluded in the cavity thickness set between the reflective layer 711 and the emissive layer 721. Accordingly, the number of black spots in the predetermined thickness of the first and second hole injection sub-layers (HIL) 221 and 222 and the hole transport layer (HTL) 723 can be decreased by increasing the thickness of the semi-transparent layer 726 between the emissive layer 721 and the reflective layer 711.

Figure 4:
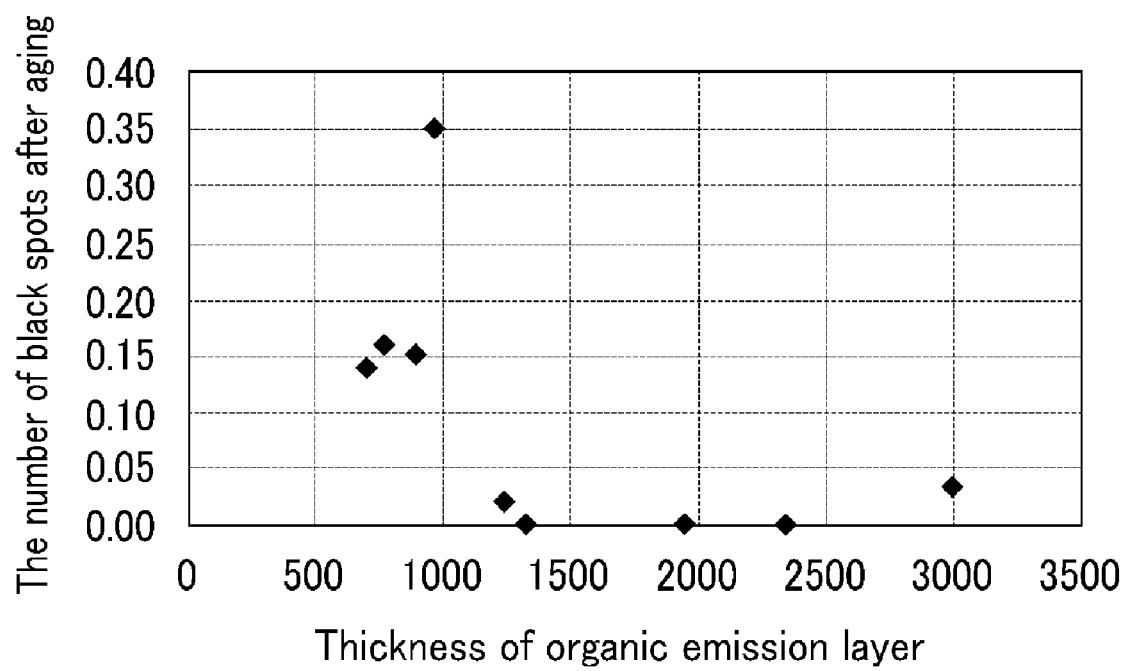
FIG. 4 is a graph illustrating the relationship between the thickness of the organic layer of an embodiment of an organic light emitting diode display and the number of black spots after-aging on the display.

FIG. 4 is a graph illustrating the relationship between the thickness of the organic layer of an embodiment of an organic light emitting diode display and the number of black spots after-aging on the display. Referring to FIG. 4, the number of black spots is rapidly decreased when the thickness of the organic layer 720 is greater than 1000 Å, and most of the black spots disappear when the thickness is greater than 1300 Å. Accordingly, as in the exemplary embodiment shown in FIG. 3, the thickness of the organic layer 720 exceeds 1300 Å in the red, green, and blue pixels R70, G70, and B70 so that the number of black spots may be decreased or mostly eliminated. In some embodiments, the thickness of the organic layer 720 is in a range from about 1300 Å to about 3500 Å. In other embodiments, the thickness may be increased to about 5000 Å.

A thin film cavity may be formed between the semi-transparent layer 726 and the reflective layer 711, and between the semi-transparent layer 726 and the emissive layer 721. As indicated in Table 1 below, light efficiency is increased two-fold in the thin film cavity of the red pixel R70 and the green pixel G70.

Conventionally, the thickness of the organic layer is typically 1300 Å, 950 Å, and 700 Å respectively in the red, green, and blue pixels, and the sum of the thicknesses of the hole injection layer (HIL) and the hole transport layer (HTL) is typically 500 Å, 250 Å, and 250 Å respectively in the red, green, and blue pixels. In some embodiments, color coordinates of the thin film cavity are (0.675, 0.325) in the red pixel, (0.239, 0.695) in the green pixel, and (0.140, 0.077) in the blue pixel, and color coordinates of the thick film cavity are (0.670, 0.330) in the red pixel, (0.220, 0.720) in the green pixel, and (0.138, 0.055) in the blue pixel. Color coordinates according to the exemplary embodiment include a color coordinate of the thin film cavity in the red and green pixels R70 and G70 and a color coordinate of the thick film cavity in the blue pixel B70, and accordingly, the light efficiency is improved.

As shown in the embodiment of FIG. 3, the semi-transparent layer 726 is not formed in the blue pixel B70. Therefore, in the blue pixel B70, a first thickness T1 of the hole injection layer (HIL) 722 is greater than a second thickness T2 which is the sum of the thicknesses of the first hole injection sub-layer (HIL) 221 and the semi-transparent layer 726, and is smaller than a third thickness T3, which is the sum of the thicknesses of the first hole injection sub-layer (HIL) 221, the semi-transparent layer 726, and the second hole injection sub-layer (HIL) 222. The thick film cavity is performed once in the blue pixel B70 compared to the red pixel R70 and the green pixel G70. Therefore, as shown by the color coordinates of the exemplary embodiment in Table 1, the color reproduction rate of the blue color is improved by setting the color representation capability of the blue color to be higher than the sRGB standard color coordinates.

TABLE 1

| | Color Coordinates of the exemplary embodiment | | Standard sRGB Color Coordinates | |
|---|---|---|---|---|
| | CIE_x | CIE_y | CIE_x | CIE_y |
| Red pixel | 0.675 | 0.325 | 0.64 | 0.33 |
| Green pixel | 0.239 | 0.695 | 0.30 | 0.60 |
| Blue pixel | 0.138 | 0.055 | 0.15 | 0.06 |

In an exemplary embodiment, in the red and green pixels, a semi-transparent layer is provided between the first electrode and the emissive layer to exclude a part of the thickness of organic material layers from the cavity thickness set between the first electrode and the emissive layer. The number of black spots is reduced while increasing the thickness between the emissive layer and the first electrode, and simultaneously thin film cavities are respectively formed between the semi-transparent layer and the first electrode and between the semi-transparent layer and the emissive layer such that light efficiency can be improved. Furthermore, since the semi-transparent layer is not used in the blue pixel, a thicker film cavity is formed between the first electrode and the emissive layer in the blue pixel compared to the thin film cavities in the red and green pixels. Accordingly, the color reproduction rate can be improved by setting the color representation capability of the blue pixel to be higher than the sRGB standard color coordinates.

While this disclosure has been described in connection with certain exemplary embodiments, it is to be understood that the invention is not limited to the disclosed embodiments, but, on the contrary, is intended to cover various modifications and equivalent arrangements.

What is claimed is:

1. An organic light emitting diode (OLED) display comprising:
    a substrate main body;
    a plurality of pixels formed above the substrate main body, each pixel comprising an organic light emitting diode (OLED) and emitting light of at least one color among red, green and blue; and
    an encapsulation substrate coupled to the substrate main body in a sealed manner to cover the OLED, wherein the OLED comprises:
    a first electrode injecting holes,
    a second electrode injecting electrons,
    an emissive layer formed between the first and second electrodes, and
    a hole injection layer and a hole transport layer sequentially formed between the first electrode and the emissive layer,
    wherein the OLEDs in the red and green pixels further comprise a semi-transparent layer formed between the first electrode and the emissive layer wherein the semi-transparent layer is formed in at least one of the hole injection layer, the hole transport layer, between the hole injection layer and the hole transport layer, and between the hole transport layer and the emissive layer.

2. The OLED display of claim 1, wherein, in the red and green pixels, the hole injection layer comprises:
    a first hole injection sub-layer formed between the first electrode and the semi-transparent layer, and
    a second hole injection sub-layer formed between the semi-transparent layer and the emissive layer.

3. The OLED display of claim 2, wherein, in a blue pixel, the hole injection layer has a thickness that is greater than the sum of the thicknesses of the first hole injection sub-layer and the semi-transparent layer, and that is less than the sum of the thicknesses of the first hole injection sub-layer, the semi-transparent layer, and the second hole injection sub-layer.

4. The organic light emitting element of claim 1, wherein the semi-transparent layer comprises a metal.

5. The OLED display of claim 1, wherein the semi-transparent layer comprises at lest one of Al, Ag, Ca, CaAg, AlAg, MgAg, and an alloy containing one or more thereof.

* * * * *

UNITED STATES PATENT AND TRADEMARK OFFICE
CERTIFICATE OF CORRECTION

PATENT NO. : 8,384,072 B2
APPLICATION NO. : 13/004399
DATED : February 26, 2013
INVENTOR(S) : Jeong et al.

It is certified that error appears in the above-identified patent and that said Letters Patent is hereby corrected as shown below:

In the Claims

In column 8 at line 54 (approx.), In Claim 4, change "organic light emitting element" to --OLED display--.

In column 8 at line 57 (approx.), In Claim 5, change "lest" to --least--.

Signed and Sealed this
Fifth Day of November, 2013

Teresa Stanek Rea
*Deputy Director of the United States Patent and Trademark Office*